United States Patent
Selvakumar et al.

(10) Patent No.: US 10,492,346 B2
(45) Date of Patent: Nov. 26, 2019

(54) THERMAL REGULATION FOR HEAD-MOUNTED DISPLAY

(71) Applicant: Apple Inc., Cupertino, CA (US)

(72) Inventors: Sivesh Selvakumar, Sunnyvale, CA (US); Laura M. Campo, Santa Clara, CA (US); Timothy Y. Chang, Sunnyvale, CA (US); Holly E. Gerhard, Cupertino, CA (US); Fletcher R. Rothkopf, Sunnyvale, CA (US); Jae Hwang Lee, Los Gatos, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 16/118,526

(22) Filed: Aug. 31, 2018

(65) Prior Publication Data
US 2019/0075689 A1 Mar. 7, 2019

Related U.S. Application Data

(60) Provisional application No. 62/555,122, filed on Sep. 7, 2017.

(51) Int. Cl.
| | |
|---|---|
| *H05K 7/20* | (2006.01) |
| *G02B 27/01* | (2006.01) |
| *G02B 27/00* | (2006.01) |

(52) U.S. Cl.
CPC ..... *H05K 7/20972* (2013.01); *G02B 27/0006* (2013.01); *G02B 27/017* (2013.01);
(Continued)

(58) Field of Classification Search
CPC .......... G06F 1/163; G06F 3/011; G06F 3/012; H05K 5/0017; G02B 27/0176;
(Continued)

(56) References Cited

U.S. PATENT DOCUMENTS

| | | | |
|---|---|---|---|
| 3,391,407 | A | 7/1968 | Waters |
| 3,548,415 | A | 12/1970 | Waters |

(Continued)

FOREIGN PATENT DOCUMENTS

| | | |
|---|---|---|
| CN | 105934134 A | 9/2016 |
| CN | 106445143 A | 2/2017 |

(Continued)

OTHER PUBLICATIONS

Ranasinghe, Nimesha et. al., "Ambiotherm: Enhancing Sense of Presence in Virtual Reality by Simulating Real-World Environmental Conditions", Temperature Interfaces, CHI 2017, May 6, 2017, http://dx.doi.org/10.1145/3025453.3025723, 12 pp.

(Continued)

*Primary Examiner* — James Wu
*Assistant Examiner* — Michael A Matey
(74) *Attorney, Agent, or Firm* — Young Basile Hanlon & MacFarlane, P.C.

(57) ABSTRACT

A head-mounted display to be worn by a user includes a housing, a component chamber defined in the housing, and electronic components that generate heat. The electronic components are located in the component chamber of the housing. The head-mounted display also includes a first fan for causing air to flow through the component chamber.

20 Claims, 15 Drawing Sheets

(52) U.S. Cl.
CPC ..... *G02B 27/0176* (2013.01); *H05K 7/20136* (2013.01); *H05K 7/20209* (2013.01)

(58) Field of Classification Search
CPC .......... G02B 2027/0178; G02B 27/017; G02B 27/0172; G02B 27/028; G02B 2027/0156; G02B 27/0093; G02B 2027/0134; G02B 2027/0138; G02B 2027/014; G02B 2027/0154; G02B 2027/0169; G02B 2027/0187; G02B 2027/0198; G02B 27/0006; G02B 27/022; G02B 27/2228; G02B 7/023; G02B 2027/0136; G02B 2027/0159; G02B 2027/0161; G02B 2027/0183; G02B 27/0179; A42B 3/286; A42B 1/008; A42B 3/285

See application file for complete search history.

(56) References Cited

U.S. PATENT DOCUMENTS

| | | | |
|---|---|---|---|
| 3,813,696 A | 6/1974 | Yeager | |
| 4,672,968 A | 6/1987 | Lenox et al. | |
| 5,193,347 A | 3/1993 | Apisdorf | |
| 5,561,862 A | 10/1996 | Flores, Sr. | |
| 5,696,521 A * | 12/1997 | Robinson | G02B 27/017 345/8 |
| 7,296,304 B2 | 11/2007 | Goldsborough | |
| 8,395,704 B2 | 3/2013 | Verstegen et al. | |
| 9,529,397 B2 | 12/2016 | Park | |
| 9,733,480 B2 * | 8/2017 | Baek | G02B 27/0176 |
| 10,018,838 B2 * | 7/2018 | Richards | G02B 27/0093 |
| 2002/0181115 A1 | 12/2002 | Massof et al. | |
| 2014/0249690 A1 | 9/2014 | Park | |
| 2014/0333773 A1 | 11/2014 | Davis et al. | |
| 2015/0138645 A1 * | 5/2015 | Yoo | G02B 27/0101 359/630 |
| 2015/0234189 A1 * | 8/2015 | Lyons | G02B 27/0172 345/174 |
| 2016/0004085 A1 * | 1/2016 | Stroetmann | G02B 27/017 345/8 |
| 2016/0212879 A1 * | 7/2016 | Nikkhoo | H05K 7/20127 |
| 2016/0255748 A1 | 9/2016 | Kim et al. | |
| 2017/0060177 A1 | 3/2017 | Rahim et al. | |
| 2017/0153672 A1 * | 6/2017 | Shin | G02B 27/0176 |
| 2017/0160801 A1 * | 6/2017 | Miyaguchi | G06F 3/012 |
| 2017/0184863 A1 | 6/2017 | Balachandreswaran et al. | |
| 2017/0266676 A1 * | 9/2017 | Fateh | B05B 7/2497 |
| 2017/0311483 A1 * | 10/2017 | Kawai | G02B 27/0176 |
| 2018/0098465 A1 * | 4/2018 | Reynolds | H05K 7/20972 |
| 2018/0103917 A1 * | 4/2018 | Kim | G02B 27/017 |
| 2018/0196485 A1 * | 7/2018 | Cheng | G06F 1/206 |
| 2018/0307282 A1 * | 10/2018 | Allin | G06F 1/203 |
| 2019/0072772 A1 * | 3/2019 | Poore | G02B 27/0176 |
| 2019/0192965 A1 * | 6/2019 | Chapman | A63F 13/28 |

FOREIGN PATENT DOCUMENTS

| | | |
|---|---|---|
| CN | 205992090 U | 3/2017 |
| CN | 106646871 A | 5/2017 |
| CN | 206193362 U | 5/2017 |

OTHER PUBLICATIONS

Peiris, Roshan, et al., "Thermo VR: Exploring Integrated Thermal Haptic Feedback With Head Mounted Displays", Virtual Reality, CHI 2017, May 6, 2017, http://dx.doi.org/10.1145/3025453.3025824, 5 pp.

Sato, Yuka, et. al., "Investigating Haptic Perception of and Physiological Responses to Air Vortex Rings on a User's Cheek", Haptics on Skin, CHI 2017, May 6, 2017, http://dx.doi.org/10.1145/3025453.3025501, 12 pp.

Rietzler, Michael, et. al., "VaiR: Simulating 3D Airflows in Virtual Reality", Interactions in Virtual Reality, CHI 2017, May 6, 2017, http://dx.doi.org/10.1145/3025453.3026009, 9 pp.

James, Paul, "'Vive N Chill' is a Cooling Solution for HTC Vive Users With Sweaty VR Faces", https://www.roadtovr.com/vive-n-chill-cooling-solution-htc-vive-users-sweaty-vr-faces/, Jun. 26, 2017, 3 pp.

International Search Report and Written Opinion issued in International Application No. PCT/US2018/049000 dated Jan. 2, 2019 (13 pp).

* cited by examiner

THERMAL REGULATION FOR HEAD-MOUNTED DISPLAY

CROSS-REFERENCE TO RELATED APPLICATIONS

This application claims the benefit of U.S. Provisional Application No. 62/555,122, filed on Sep. 7, 2017, the content of which is hereby incorporated by reference in its entirety for all purposes.

TECHNICAL FIELD

The application relates generally to thermal regulation for head-mounted displays.

BACKGROUND

Head-mounted displays are worn on a user's head and incorporate one or more optical display devices. Head-mounted displays incorporate electronic components such as processors, and these components generate heat.

SUMMARY

One aspect of the disclosure is a head-mounted display to be worn by a user. The head-mounted display includes a housing, a component chamber defined in the housing, and electronic components that generate heat. The electronic components are located in the component chamber of the housing. The head-mounted display also includes a first fan for causing air to flow through the component chamber.

Another aspect of the disclosure is a head-mounted display to be worn by a user. The head mounted display includes a housing, an eye chamber defined by the housing, a face seal, and a fan that causes air to flow through the face seal.

Another aspect of the disclosure is a head-mounted display to be worn by a user. The head-mounted display includes a housing, an eye chamber defined by the housing, a display, electronic components that cause content to be output by the display, and a fan that causes air to flow through the eye chamber. The fan is controlled by the electronic components based on the content.

DETAILED DESCRIPTION

Components included in head-mounted displays can generate heat. During use of a head-mounted display, the heat generated by a head-mounted display may be noticeable to the user, and detract from the user's ability to enjoy use of the device. The disclosure herein is directed to head-mounted displays that incorporate thermal regulation components to reduce heat levels and enhance the user experience.

Figure 1:
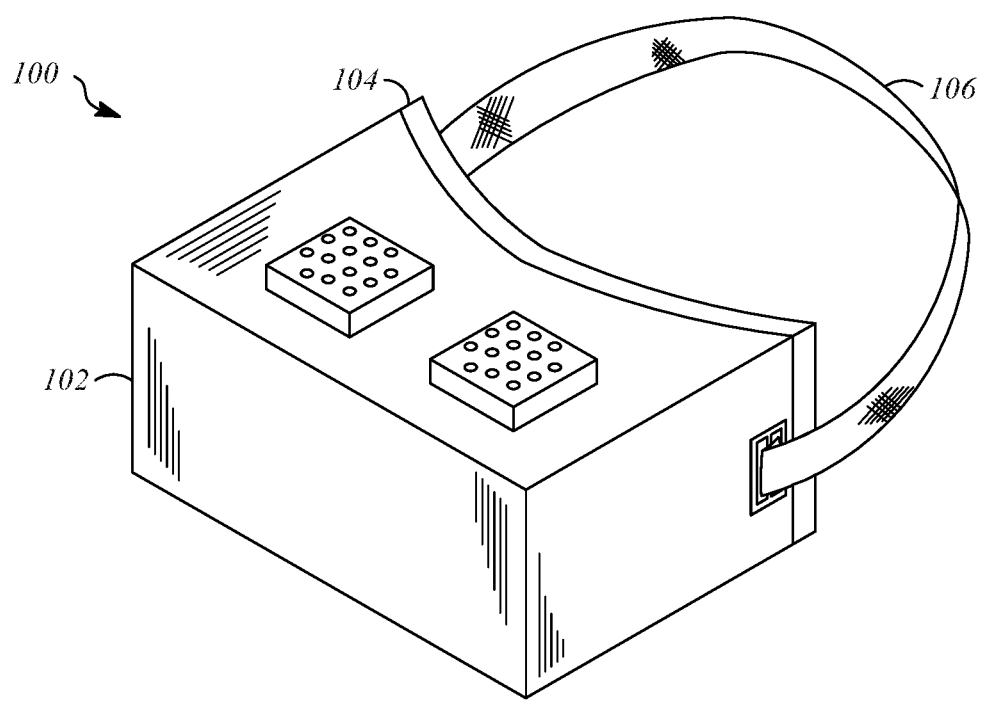
FIG. 1 is a perspective view illustration showing a head-mounted display.

FIG. 1 is a perspective view illustration showing a head-mounted display 100. The head-mounted display includes a housing 102, a face seal 104, and a headband 106. The face seal 104 and the headband 106 are connected to the housing 102. The face seal 104 is configured to engage and conform to the user's head in the area around the user's eyes. The headband 106 is configured to support the housing 102 relative to the user's head. In the illustrated example, the housing 102 is a generally rectangular structure, and headband 106 is a structure such as a strap or a rigid member that connects to the lateral sides of the housing 102 to extend peripherally around a user's head. The housing 102 may be a single-piece structure or may be a multi-piece structure, and is either rigid or semi-rigid. The headband 106 may include adjustment features, such as variable length strap assemblies that are adjusted using fasteners such as buttons, buckles, or hook-and-loop fasteners. The housing 102 and the headband 106 are shown and described using a "goggles" type headband configuration to provide context, and it should be understood that the features described herein can be utilized with head-mounted displays that utilize a broad range of configurations. As one example, the headband 106 could include an additional strap that extends over the center of the user's head. As another example, the housing 102 and the headband 106 could utilize a "halo" type headband configuration in which the headband engages the user's forehead, and is the headband is connected to an upper part of the housing such that the housing is suspended form the headband. Other headband configurations can also be used.

Figure 2A:
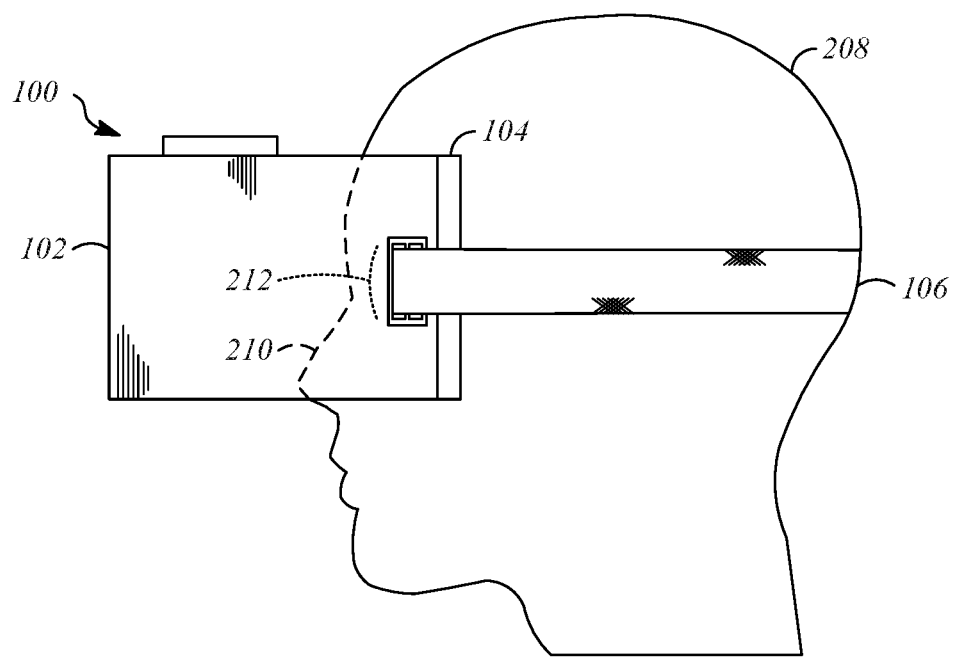
FIG. 2A is a side view showing the head-mounted display worn by a user.
Figure 2B:
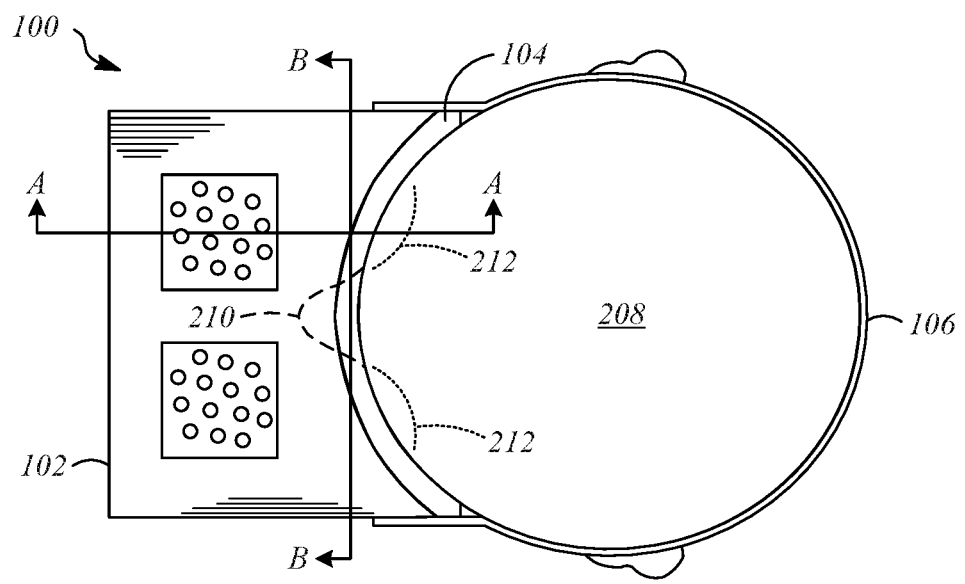
FIG. 2B is a top view showing the head-mounted display worn by the user.

FIG. 2A is a side view showing the head-mounted display 100 worn by a user 208, and FIG. 2B is a top view showing the head-mounted display 100 worn by the user 208. The face seal 104 contacts an upper part of the face 210 of the user 208. As an example, the face seal 104 may contact the forehead, the temples, the cheeks, and/or the nose of the user 208, and extend around the eye area 212 of the user 208.

Figure 3:
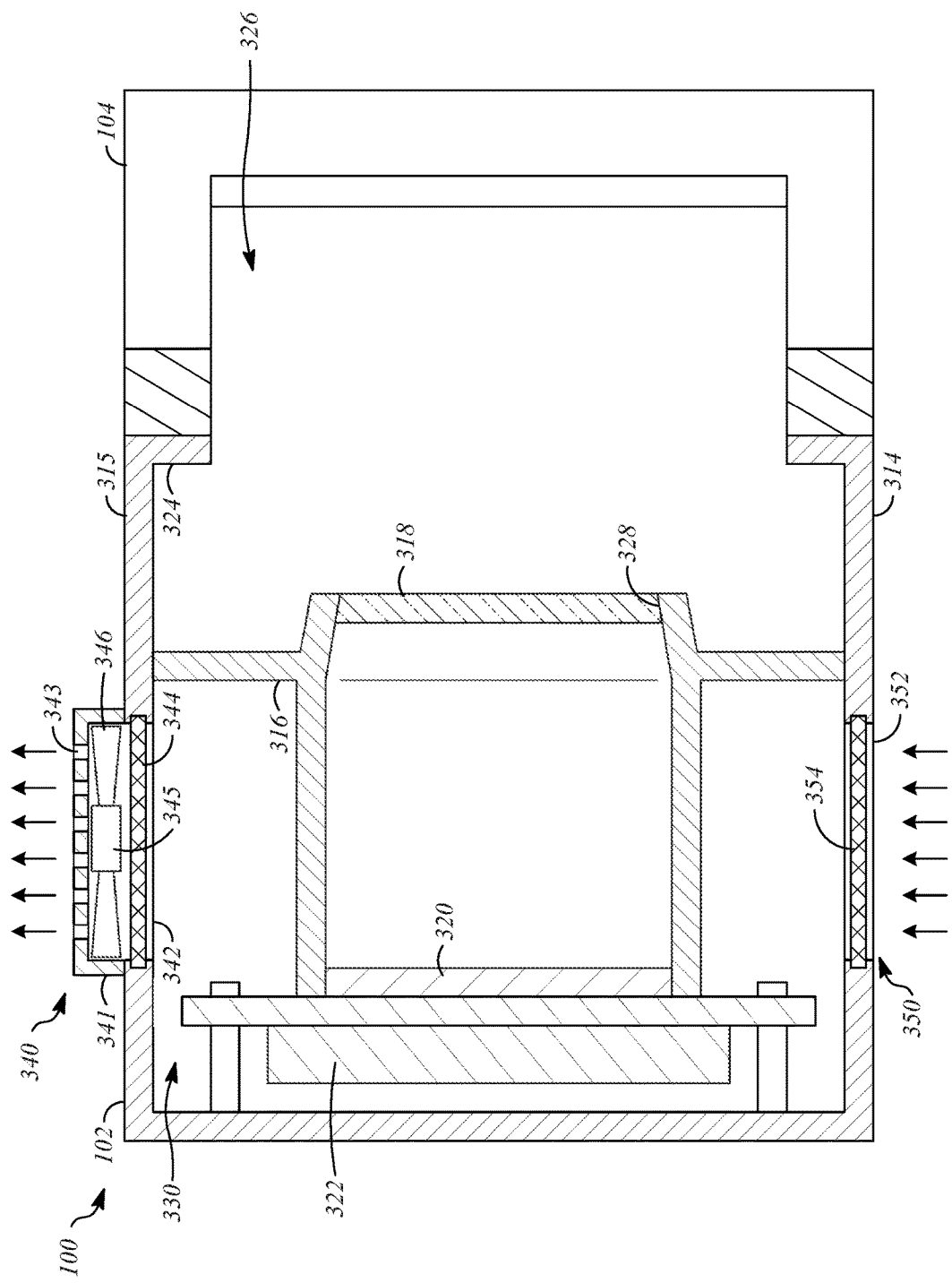
FIG. 3 is a side cross-section view of the head-mounted display taken along line A-A of FIG. 2B including thermal regulation components according to a first example.

FIG. 3 is a cross-section view of the head-mounted display 100 taken along line A-A of FIG. 2B. The head-mounted display 100 includes the housing 102, which includes a lower wall 314, an upper wall 315, and a divider wall 316. The head-mounted display 100 also includes lenses 318 (e.g. two lenses that are each paired with one of the user's eyes), display devices 320, and electronic components 322.

The housing 102 includes an external structure of the head-mounted display 100 and may include parts of an internal structure of the head-mounted display 100. The housing 102 is connected to the headband 106 (FIGS. 1-2B) or other support structure. Internal spaces of the head-mounted display 100 are defined by the housing 102, in order to support and/or enclose portions of the head-mounted display 100 such as the divider wall 316, the lenses 318, the display devices 320, and the electronic components 322. The housing 102 may be a multi-part structure, or may be a single part structure. The housing 102 may be rigid or semi rigid, and with respect to multi-part structures for the housing 102, may include various portions having differing material properties inclusive of rigid portions and flexible portions.

A front end of the housing 102 includes a peripheral portion 324, which is adjacent to the user 208 when worn. The peripheral portion 324 extends around part or all of the housing 102 at the front end, and provides a support surface or support structure for the face seal 104. Other components and/or structures may be formed on or supported by the peripheral portion 324, such as sensors.

The divider wall 316 has a first side that is exposed the exterior, and is adjacent to an eye chamber 326. The eye chamber 326 is defined within the housing 102 between the divider wall 316 and the face seal 104. When the head-mounted display 100 is worn by the user 208, the eyes of the user 208 are positioned adjacent to the eye chamber 326. By engagement of the face seal 104 with the face 210 of the user 208, the face seal 104 is operable to reduce or eliminate the amount of light from the environment outside the face seal 104 that enters the eye chamber 326. The face seal 104 may, in some implementations, be porous to allow air to flow into and/or out of the eye chamber 326, while still blocking light.

The divider wall 316 may support the lenses 318, either directly or indirectly. In the illustrated example, the lenses 318 are connected to the divider wall 316 and are located in apertures 328 that are formed in the divider wall 316. Other implementations of the head-mounted display 100 may connect the lenses 318 to the divider wall 316 indirectly. As one example, the lenses 318 can be supported by an inter-pupillary distance adjustment mechanism that is operable to move the lenses 318 laterally toward or away from each other. As another example, the lenses 318 can be supported by an eye relief adjustment mechanism that is operable to adjust the position of the lenses 318 in the front-to-rear direction of the housing 102 to change the distance between the eyes of the user 208 and the lenses 318.

The lenses 318 focus, redirect, and reshape the images from the display devices 320 to achieve a desired focal length and other optical properties. The display devices 320 are located in the housing 102 and are oriented such that they emit light (e.g., in patterns that form images) toward the lenses 318. The lenses 318 direct the images emitted by the display devices 320 toward the eyes of the user 208 in a manner that simulates the way the light from a three-dimensional environment reaches the eyes of the user 208. As one example, the lenses 318 may be biconvex lenses. As another example, the lenses 318 may be Fresnel lenses. Focal lengths for the lenses 318 may be, for example, between 25 mm and 50 mm.

On a second side of the divider wall 316, opposite the eye chamber 326, a component chamber 330 is formed between the divider wall 316 and the housing 102. The component chamber 330 is an internal chamber having a substantially enclosed spaced defined by the housing 102 and the divider wall 316. In some implementations, multiple internal chambers are present. In the illustrated example, the display devices 320 and the electronic components 322 are located in the internal chamber. The display devices 320 may be supported by the divider wall 316 (as illustrated), by the housing 102, or by other structures that are located in the component chamber 330.

The electronic components 322 are located in the component chamber 330 and may be supported by the housing 102 or by other structures that are present in the component chamber 330. The electronic components 322 are connected to the display devices 320 and include components that generate or receive content, in the form or signals or data. The content is provided by the display devices to be output for display by the display devices 320 as images defined by emitted light. The electronic components 322 may also include sensors that detect conditions that are relevant to operation of the head-mounted display 100, such as the position and orientation of the head-mounted display 100.

The head-mounted display 100 includes thermal regulation components that can be utilized to reduce heat levels. For example, the thermal regulation components can help control an air temperature within the eye chamber 326. In the illustrated example, the thermal regulation components include an exhaust fan 340 and an intake vent 350. The exhaust fan 340 is located on the upper wall 315 of the housing 102 above the component chamber 330, and is in direct communication with the component chamber 330 to receive air from the component chamber 330. The intake vent 350 is located on the lower wall 314 of the housing 102 below the component chamber 330, and is in direct communication with the component chamber 330 to provide air to the component chamber 330.

The exhaust fan 340 can be located in a fan housing 341 that defines an inlet 342 and outlet ports 343. The inlet 342 may be an opening that is formed in the upper wall 315 of the housing 102 to receive air from inside the housing 102. The inlet 342 may be provided with a filter 344 to reduce entry of foreign particles (e.g., dust) into the housing 102. As an example, the filter 344 may be or include a layer of fabric. The exhaust fan 340 includes a propulsion component such as an electric motor 345 and one or more air moving components, such as fan blades 346. In the illustrated example, the exhaust fan 340 is an axial inlet/axial outlet type fan. Other configurations may be used for the exhaust fan 340, such as an axial inlet/radial outlet configuration.

The intake vent 350 is a passive component that allows air to enter the housing 102. In the illustrated example, the intake vent 350 includes an opening 352 and a filter 354. The opening 352 is formed in the lower wall 314 of the housing 102 to admit air from outside the housing 102 into the interior of the housing 102, such as into the component chamber 330 in this example. The filter 354 is positioned in or over the opening 352 to reduce entry of foreign particles into the housing 102 as described with respect to the filter 344.

The exhaust fan 340 can be controlled to achieve desired thermal characteristics. The exhaust fan 340 can be controlled based on temperature, as detected by one or more sensors. Control of the exhaust fan 340 may also be based on other factors, such as noise generation and battery use. The content output by the head-mounted display 100 can also be considered during fan control, such as by increasing or decreasing fan speed based on audio volume. Simple control logic can be utilized, such as by operating the exhaust fan 340 when one or more values cross thresholds, or more complicated control logic can be utilized, such as a trained machine learning model that controls temperature based on observed user behaviors.

As one example, a temperature can be detected by measuring the temperature of one of the electronic components 322 using a sensor included in the electronic components 322. A temperature measurement can be obtained from the output signal of a temperature sensor, such as a temperature sensor included in a processor or a system on a chip. As another example, a temperature sensor can be included in the component chamber 330 to detect an air temperature in the component chamber 330. As another example, a temperature sensor can be included in the eye chamber 326 to detect an air temperature in the eye chamber 326.

In some implementations, contacting or non-contacting sensors can be utilized to measure user characteristics that are indicative of user thermal comfort. As one example, infrared sensors can be utilized to measure temperature of the user's skin. As another example, infrared sensors can be utilized to detect presence of perspiration on the user's skin. As another example, humidity can be measured in the eye chamber 326 to estimate user comfort based on changes in humidity in the eye chamber 326.

In some implementations, air flow sensors are located in the housing 102, for example, positioned at the inlet 342 of the exhaust fan 340 and at the opening 352 of the intake vent 350. The air flow sensors can be used to control and establish a desired air flow rate through the component chamber 330.

In operation temperature of the head-mounted display 100 can be regulated by circulating outside (i.e., ambient) air through the component chamber. The exhaust fan 340 is activated and operated at a fixed speed or a variable speed based on a sensed temperature and/or other characteristic. Operation of the exhaust fan 340 causes warm air to be expelled from the component chamber 330, which in turn causes ambient air to be drawn into the component chamber 330 through the intake vent 350. Since ambient air will typically be much cooler than the air temperature in the component chamber 330, heat is removed from the component chamber.

Figure 4:
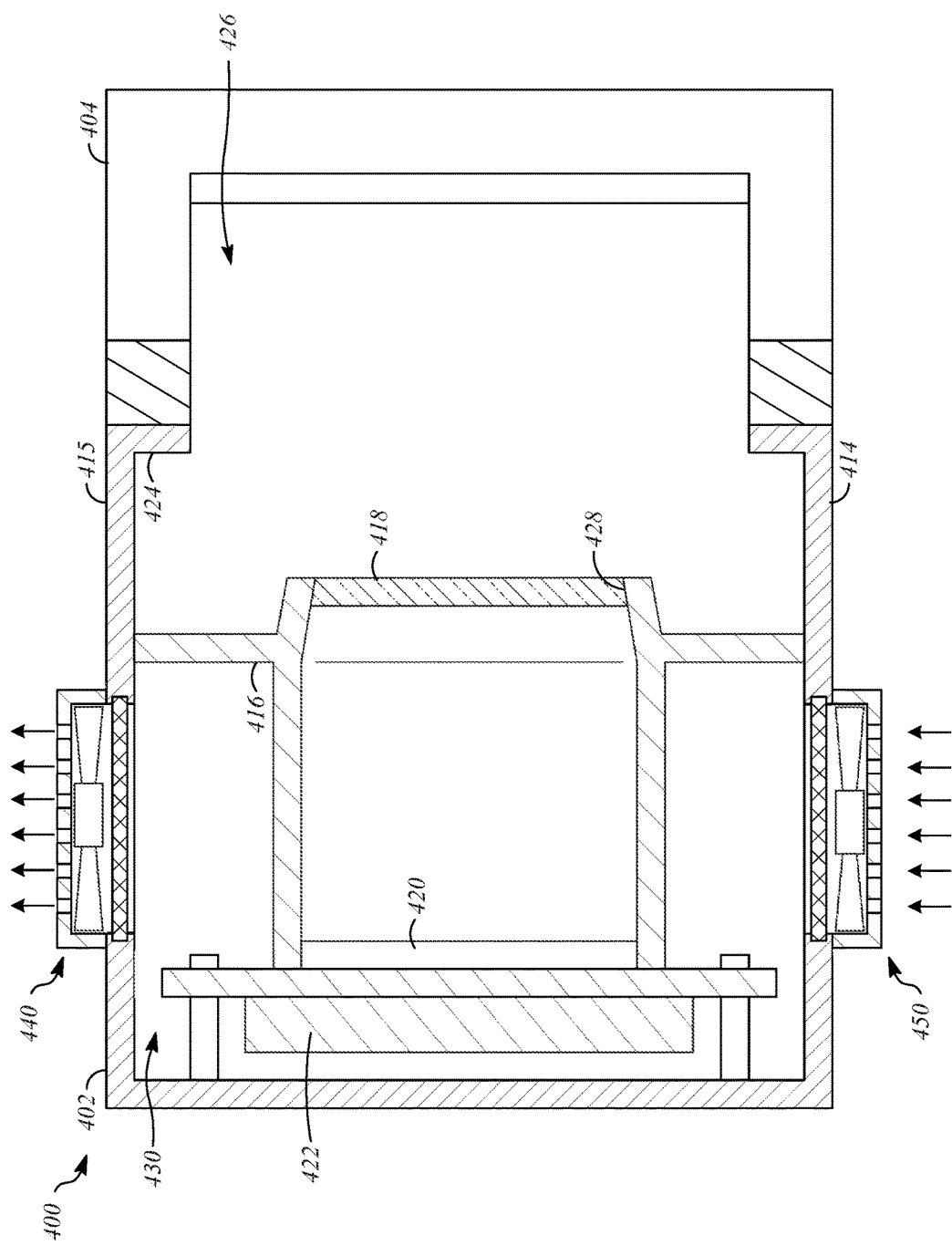
FIG. 4 is a side cross-section view of a head-mounted display including thermal regulation components according to a second example.

FIG. 4 is a cross-section view of a head-mounted display 400. The head-mounted display 400 is similar to the head-mounted display 100 except as described herein. The head-mounted display 400 includes a housing 402, a face seal 404, a lower wall 414, an upper wall 415, a divider wall 416, lenses 418, display devices 420, electronic components 422, a peripheral portion 424 of the housing 402, an eye chamber 426, apertures 428, and a component chamber 430, all of which are analogous to similarly-named components of the head-mounted display 100.

The thermal regulation components of the head-mounted display 400 include an exhaust fan 440 and an intake fan 450. The intake fan 450 actively supplies air from outside the housing 402 into the component chamber 430, at a temperature that is cooler than that of air inside the component chamber 430. The exhaust fan 440 expels warm air out of the component chamber 430 to the exterior of the housing 402.

The exhaust fan 440 is configured in the manner described with respect to the exhaust fan 340 of the head-mounted display 100, and is mounted to the housing 402 at the same location in order to receive warm air from the component chamber 430. The intake fan 450 is configured in the manner described with respect to the exhaust fan 340 of the head-mounted display 100 and is connected to the lower wall 414 to draw air into the component chamber 430 through an opening in the lower wall 414.

The exhaust fan 440 and the intake fan 450 are operated in the manner described with respect to the exhaust fan 340, but can be independently controlled. In addition, the air pressure within the component chamber 430 can be controlled by varying the fan speed of the exhaust fan 440 relative to the fan speed of the intake fan 450.

Figure 5:
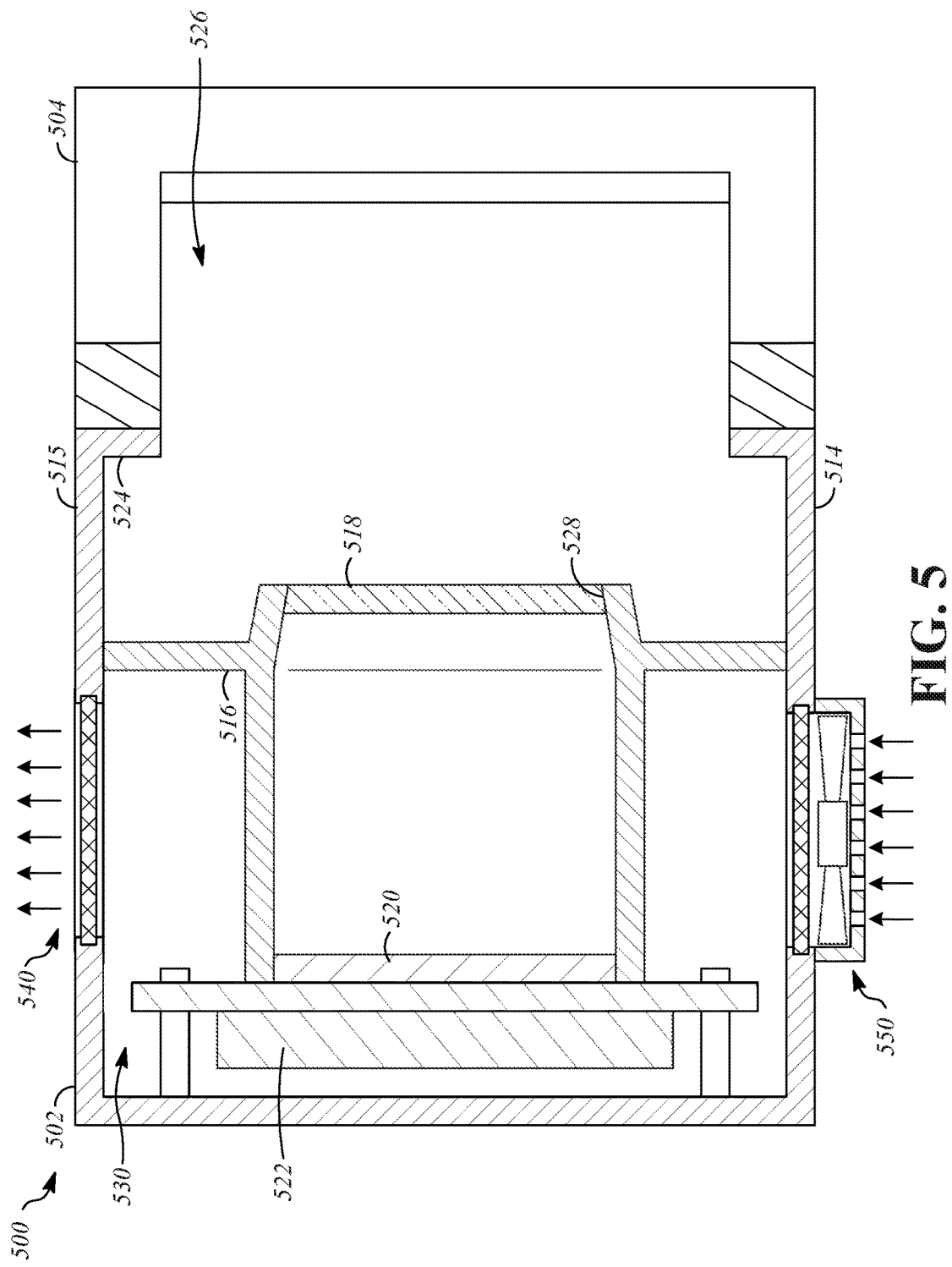
FIG. 5 is a side cross-section view of a head-mounted display including thermal regulation components according to a third example.

FIG. 5 is a cross-section view of a head-mounted display 500. The head-mounted display 500 is similar to the head-mounted display 100 except as described herein. The head-mounted display 500 includes a housing 502, a face seal 504, a lower wall 514, an upper wall 515, a divider wall 516, lenses 518, display devices 520, electronic components 522, a peripheral portion 524 of the housing 502, an eye chamber 526, apertures 528, and a component chamber 530, all of which are analogous to similarly-named components of the head-mounted display 100.

The thermal regulation components of the head-mounted display 500 include an exhaust vent 540 and an intake fan 550. The intake fan 550 actively supplies air from outside the housing 502 into the component chamber 530 at a temperature that is cooler than that of air inside the component chamber 530. The exhaust vent 540 passively allows warm air to be expelled out of the component chamber 530 to the exterior of the housing 502.

The intake fan 550 is configured in the manner described with respect to the intake fan 450 of the head-mounted display 400, and is mounted to the housing 502 at the same location to provide exterior air to the component chamber 530 through an opening in the lower wall 514. The exhaust vent 540 allows warm air to pass through an opening formed in the upper wall 515 to exit the component chamber 530.

The intake fan 550 is operated in the manner described with respect to the intake fan 450.

Figure 6:
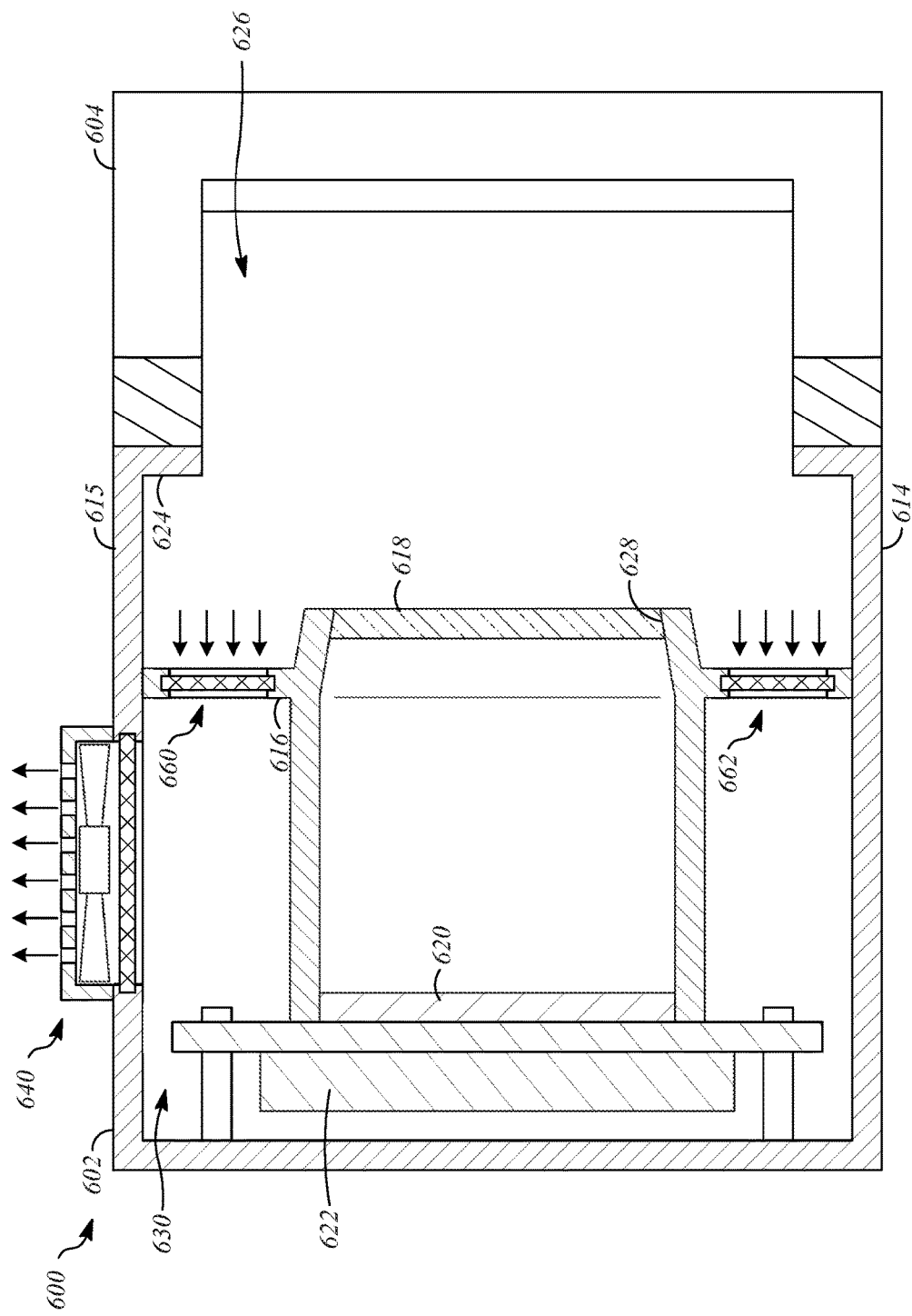
FIG. 6 is a side cross-section view of a head-mounted display including thermal regulation components according to a fourth example.

FIG. 6 is a cross-section view of a head-mounted display 600. The head-mounted display 600 is similar to the head-mounted display 100 except as described herein. The head-mounted display 600 includes a housing 602, a face seal 604, a lower wall 614, an upper wall 615, a divider wall 616, lenses 618, display devices 620, electronic components 622, a peripheral portion 624 of the housing 602, an eye chamber 626, apertures 628, and a component chamber 630, all of which are analogous to similarly-named components of the head-mounted display 100.

The thermal regulation components of the head-mounted display 600 include an exhaust fan 640 and one or more air flow passages between the eye chamber 626 and the component chamber 630, such as a first divider vent 660 and a second divider vent 662.

The first divider vent 660 is a passive component that allows air to pass between the eye chamber 626 and the component chamber 630. As an alternative, divider vents with controllable variable size openings could be utilized to regulate airflow based on operating conditions. The first divider vent 660 can be configured similar to the intake vent 350, but is positioned on the divider wall 616 to allow air to pass through an opening in the divider wall 616. In the illustrated example, the first divider vent 660 is positioned closer to the upper wall 615 of the housing 602 than to the lower wall 614 of the housing 602. The first divider vent 660 may be above a height-wise midpoint of the housing 602, and may be adjacent to the upper wall 615 of the housing 602.

The second divider vent 662 is a passive component that allows air to pass between the eye chamber 626 and the component chamber 630. The second divider vent 662 is configured similar to the intake vent 350, but is positioned on the divider wall 616 to allow air to pass through an opening in the divider wall 616. In the illustrated example, the second divider vent 662 is positioned closer to the lower wall 614 of the housing 602 than to the upper wall 615 of the housing 602. The second divider vent 662 may be below a height-wise midpoint of the housing 602, and may be adjacent to the lower wall 614 of the housing 602.

The exhaust fan 640 is configured in the manner described with respect to the exhaust fan 340 of the head-mounted display 100, and is mounted to the housing 602 at the same location in order to receive warm air from the component chamber 630 and expel the warm air to the exterior of the head-mounted display 600.

The exhaust fan 640 is operated in the manner described with respect to the exhaust fan 340. When air is expelled from the component chamber 630 by the exhaust fan 640, cooler air is drawn into the component chamber 630 from the eye chamber 626. Air is in turn drawn into the eye chamber 626 from outside of the housing 602, such as by flowing past the face seal 604, such as in areas where the face seal 604 does not contact the user, for example, near the user's nose.

Figure 7:
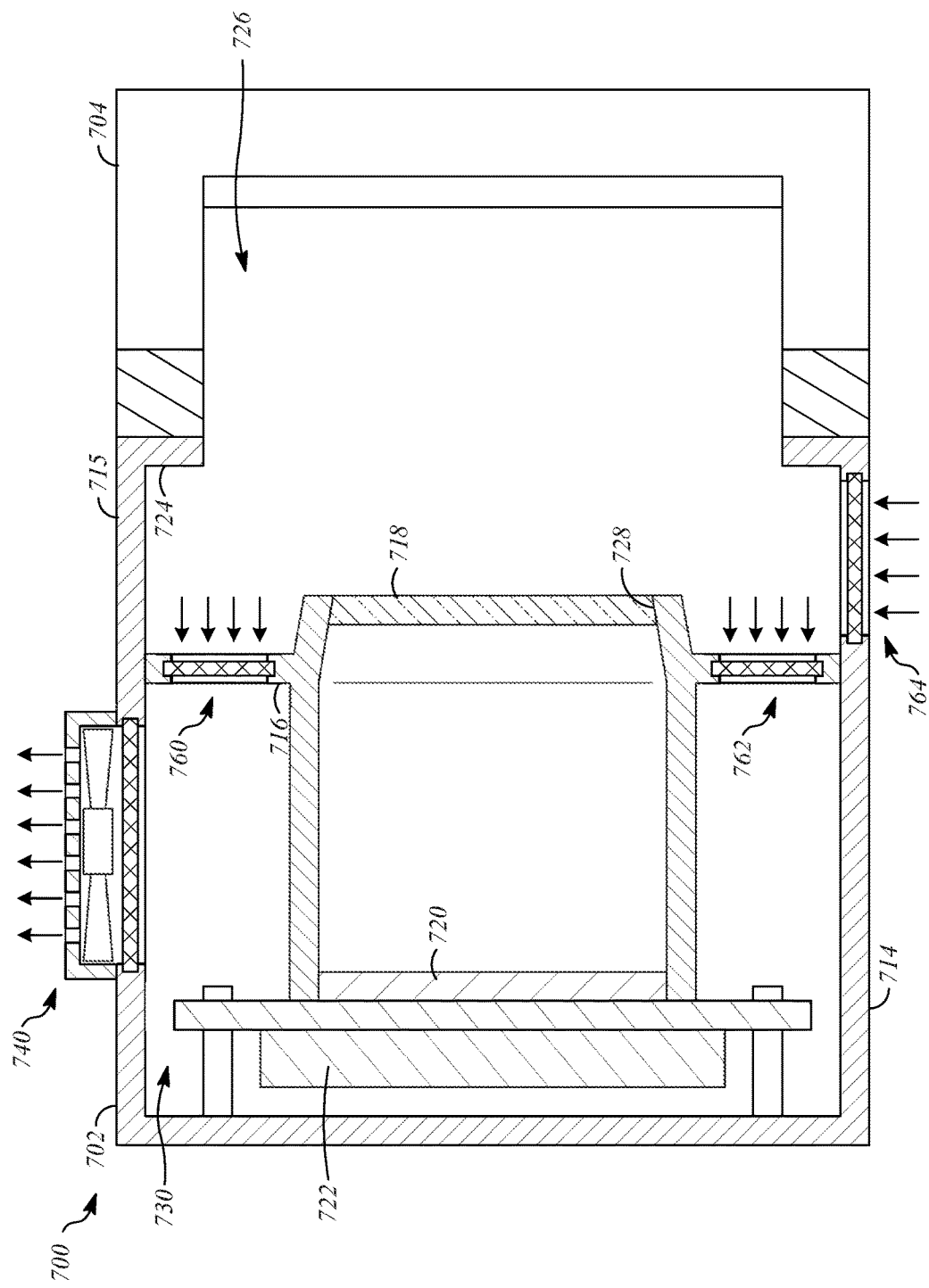
FIG. 7 is a side cross-section view of a head-mounted display including thermal regulation components according to a fifth example.

FIG. 7 is a cross-section view of a head-mounted display 700. The head-mounted display 700 is similar to the head-mounted display 100 except as described herein. The head-mounted display 700 includes a housing 702, a face seal 704, a lower wall 714, an upper wall 715, a divider wall 716, lenses 718, display devices 720, electronic components 722, a peripheral portion 724 of the housing 702, an eye chamber 726, apertures 728, and a component chamber 730, all of which are analogous to similarly-named components of the head-mounted display 100.

The thermal regulation components of the head-mounted display 700 include an exhaust fan 740, one or more air flow passages between the eye chamber 726 and the component chamber 730, such as a first divider vent 760 and a second divider vent 762, and an intake vent 764. The exhaust fan 740, the first divider vent 760, and the second divider vent 762 are configured the same as the exhaust fan 640, the first divider vent 660, and the second divider vent 662. The intake vent 764 is similar to the intake vent 350 but is positioned on the lower wall 714 to allow air to enter the eye chamber 726.

The exhaust fan 740 is operated in the manner described with respect to the exhaust fan 340. When air is expelled from the component chamber 730 by the exhaust fan 740, cooler air is drawn into the component chamber 730 from the eye chamber 726. Air is in turn drawn into the eye chamber 726 from outside of the housing 702 through the intake vent 764.

Figure 8:
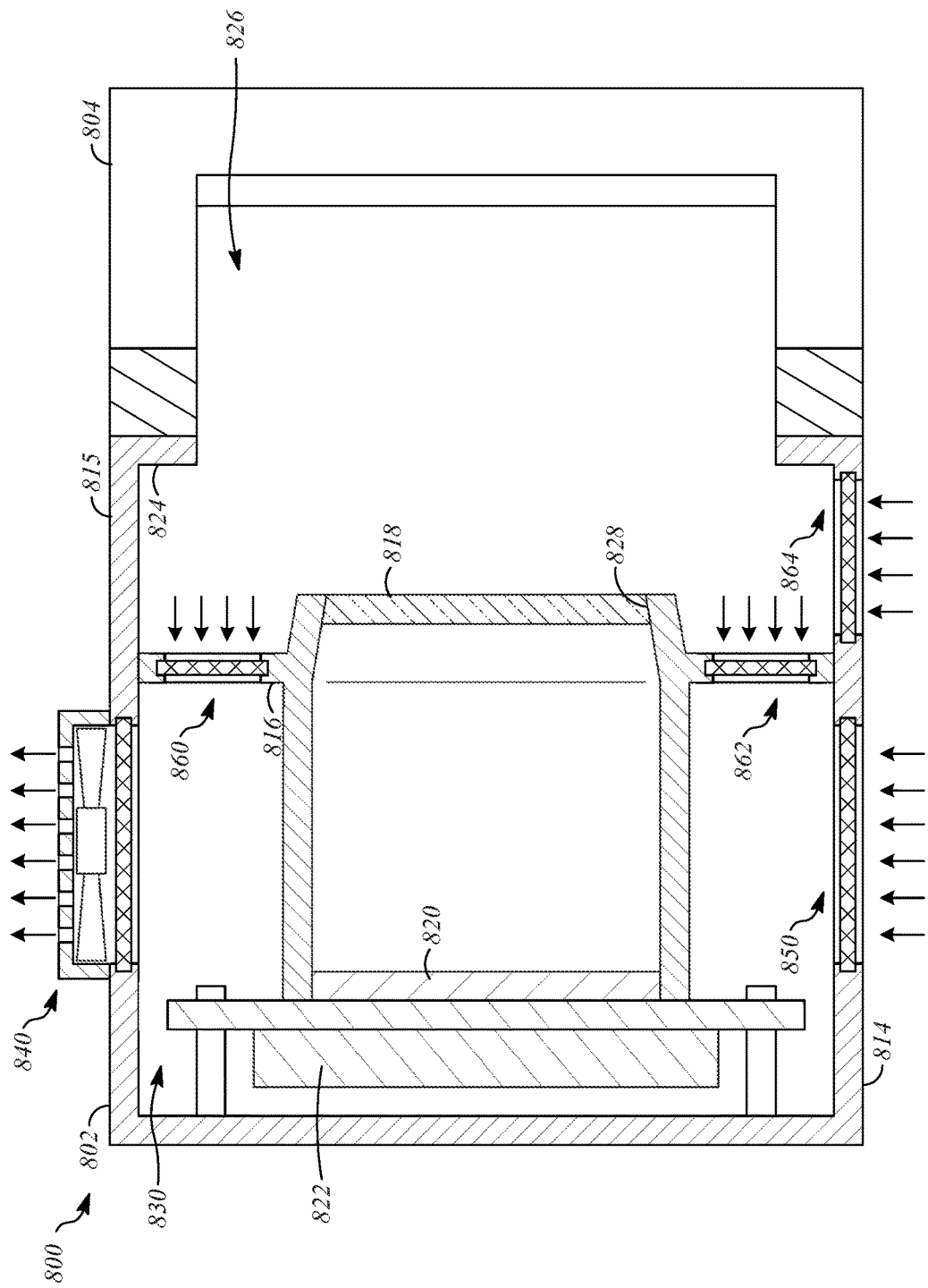
FIG. 8 is a side cross-section view of a head-mounted display including thermal regulation components according to a sixth example.

FIG. 8 is a cross-section view of a head-mounted display 800. The head-mounted display 800 is similar to the head-mounted display 100 except as described herein. The head-mounted display 800 includes a housing 802, a face seal 804, a lower wall 814, an upper wall 815, a divider wall 816, lenses 818, display devices 820, electronic components 822, a peripheral portion 824 of the housing 802, an eye chamber 826, apertures 828, and a component chamber 830, all of which are analogous to similarly-named components of the head-mounted display 100.

The thermal regulation components of the head-mounted display 800 include an exhaust fan 840, one or more air flow passages between the eye chamber 826 and the component chamber 830, such as a first divider vent 860 and a second divider vent 862, a first intake vent 850 and a second intake vent 864. The exhaust fan 840, the first divider vent 860, the second divider vent 862, and the second intake vent 864 are configured the same as the exhaust fan 740, the first divider vent 760, the second divider vent 762, and the intake vent 764. The first intake vent 850 is similar to the intake vent 350 and is positioned on the lower wall 814 to allow air to enter the component chamber 830.

The exhaust fan 840 is operated in the manner described with respect to the exhaust fan 340. When air is expelled from the component chamber 830 by the exhaust fan 840, cooler air is drawn into the component chamber 830 from the exterior through the first intake vent 850 and from the eye chamber 826 through the first divider vent 860 and the second divider vent 862. Air is in turn drawn into the eye chamber 826 from outside of the housing 802 through the second intake vent 864.

Figure 9:
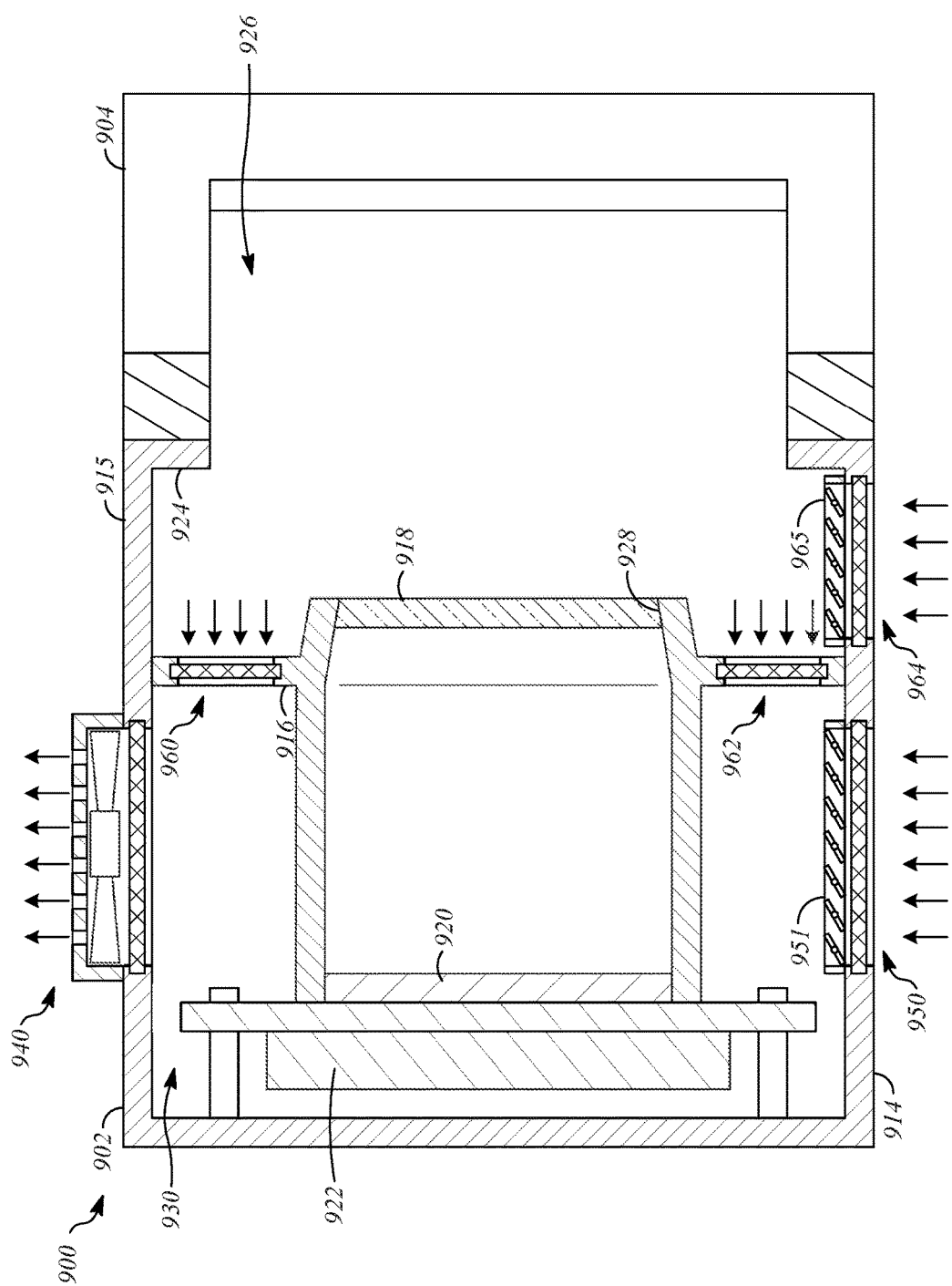
FIG. 9 is a side cross-section view of a head-mounted display including thermal regulation components according to a seventh example.

FIG. 9 is a cross-section view of a head-mounted display 900. The head-mounted display 900 is similar to the head-mounted display 100 except as described herein. The head-mounted display 900 includes a housing 902, a face seal 904, a lower wall 914, an upper wall 915, a divider wall 916, lenses 918, display devices 920, electronic components 922, a peripheral portion 924 of the housing 902, an eye chamber 926, apertures 928, and a component chamber 930, all of which are analogous to similarly-named components of the head-mounted display 100.

The thermal regulation components of the head-mounted display 900 include an exhaust fan 940, one or more air flow passages between the eye chamber 926 and the component chamber 930, such as a first divider vent 960 and a second divider vent 962, a first intake vent 950, a second intake vent 964, a first flow control component 951 that is connected to the first intake vent 950, and a second flow control component 965. The exhaust fan 940, the first divider vent 960, the second divider vent 962, the first intake vent 950, and the second intake vent 964 are configured the same as the exhaust fan 840, the first divider vent 860, the second divider vent 862, the first intake vent 850 and the second intake vent 864.

The first flow control component 951 and the second flow control component 965 are active components that can be controlled, for example, by signals received from the electronic component 922. The first flow control component 951 and the second flow control component 965 are operable to change the amount of air that flows through the first intake vent 950 and the second flow control component 965 by movement between closed and open positions, optionally including intermediate positions between the closed and open positions. The closed positions restrict air flow either completely or to a high degree, and the open positions restrict air flow minimally. The first flow control component 951 and the second flow control component 965 can be externally controllable electromechanical devices such as dampers in which doors or louvers are rotated by an electric motor, valves that seal and unseal an interface between components to open and close, or variable-size openings such as iris valves.

The exhaust fan 940 is operated in the manner described with respect to the exhaust fan 340. When air is expelled from the component chamber 930 by the exhaust fan 940, cooler air is drawn into the component chamber 930 from the exterior through the first intake vent 950 and from the eye chamber 926 through the first divider vent 960 and the second divider vent 962. Air is in turn drawn into the eye chamber 926 from outside of the housing 902 through the second intake vent 964. The amount of air drawn into the component chamber 930 from each of the first intake vent 950 and the second intake vent 964 is controlled by the positions of the first flow control component 951 and the second flow control component 965.

In an additional implementation, flow control components similar to the first flow control component 951 and the second flow control component 965 can be provided at other locations, such as at the first divider vent 960 and the second divider vent 962.

Figure 10:
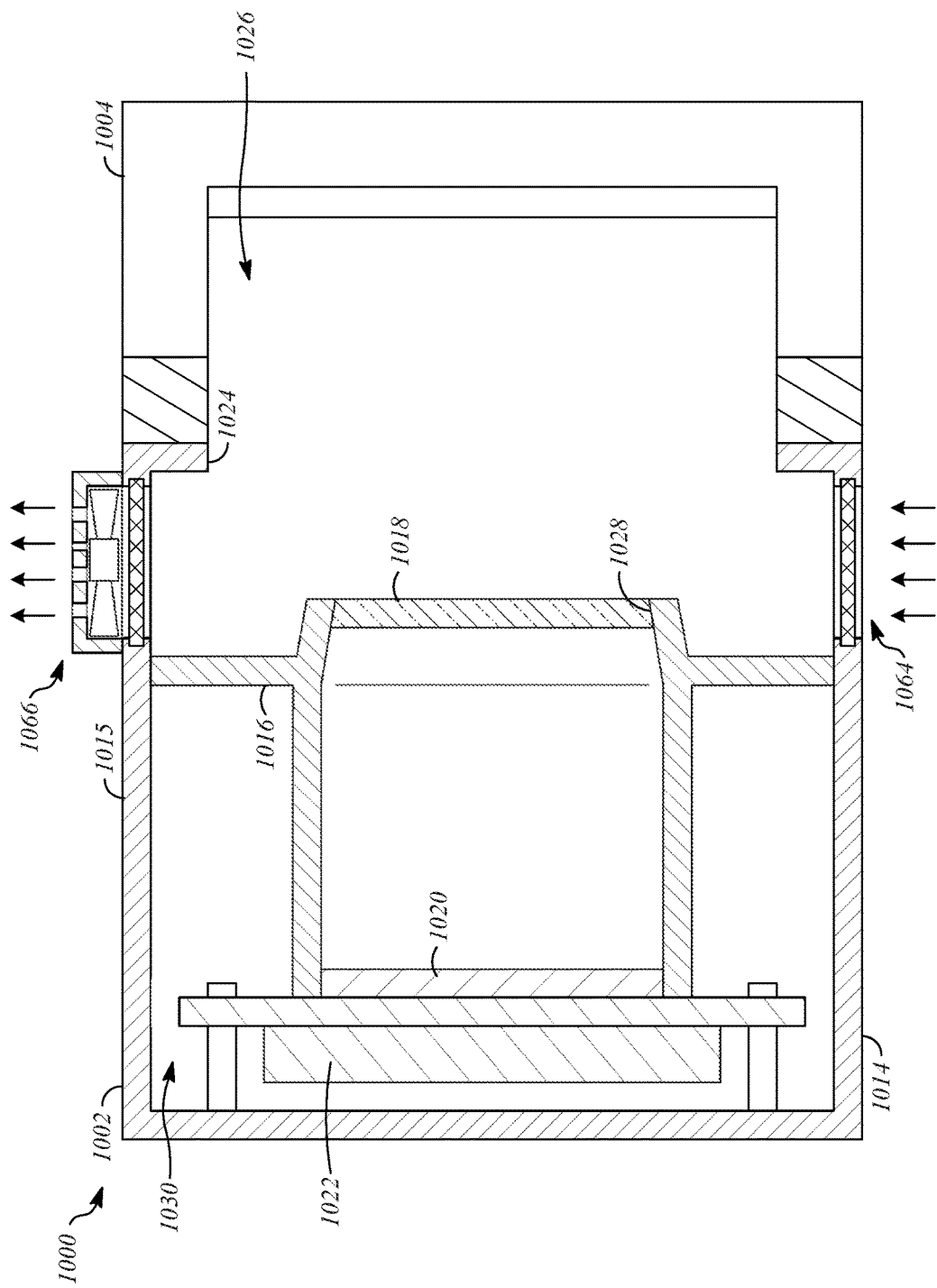
FIG. 10 is a side cross-section view of a head-mounted display including thermal regulation components side according to an eighth example.

FIG. 10 is a cross-section view of a head-mounted display 1000. The head-mounted display 1000 is similar to the head-mounted display 100 except as described herein. The head-mounted display 1000 includes a housing 1002, a face seal 1004, a lower wall 1014, an upper wall 1015, a divider wall 1016, lenses 1018, display devices 1020, electronic components 1022, a peripheral portion 1024 of the housing 1002, an eye chamber 1026, apertures 1028, and a component chamber 1030, all of which are analogous to similarly-named components of the head-mounted display 100.

The thermal regulation components of the head-mounted display 1000 include an intake vent 1064 and an exhaust fan 1066. The intake vent 1064 is configured and positioned the same as the second intake vent 964 to allow air to enter the eye chamber 1026. The exhaust fan 1066 has a configuration that is similar to that of the exhaust fan 340, but is positioned on the upper wall 1015 at an opening that extends through the upper wall 1015 to the eye chamber 1026 in order to draw air out of the eye chamber 326 directly to the exterior of the head-mounted display 1000.

The exhaust fan 1066 is operated in the manner described with respect to the exhaust fan 340. When air is expelled from the eye chamber 1026 by the exhaust fan 1066, cooler air is drawn into the eye chamber 1026 from the exterior through the intake vent 1064.

Figure 11:
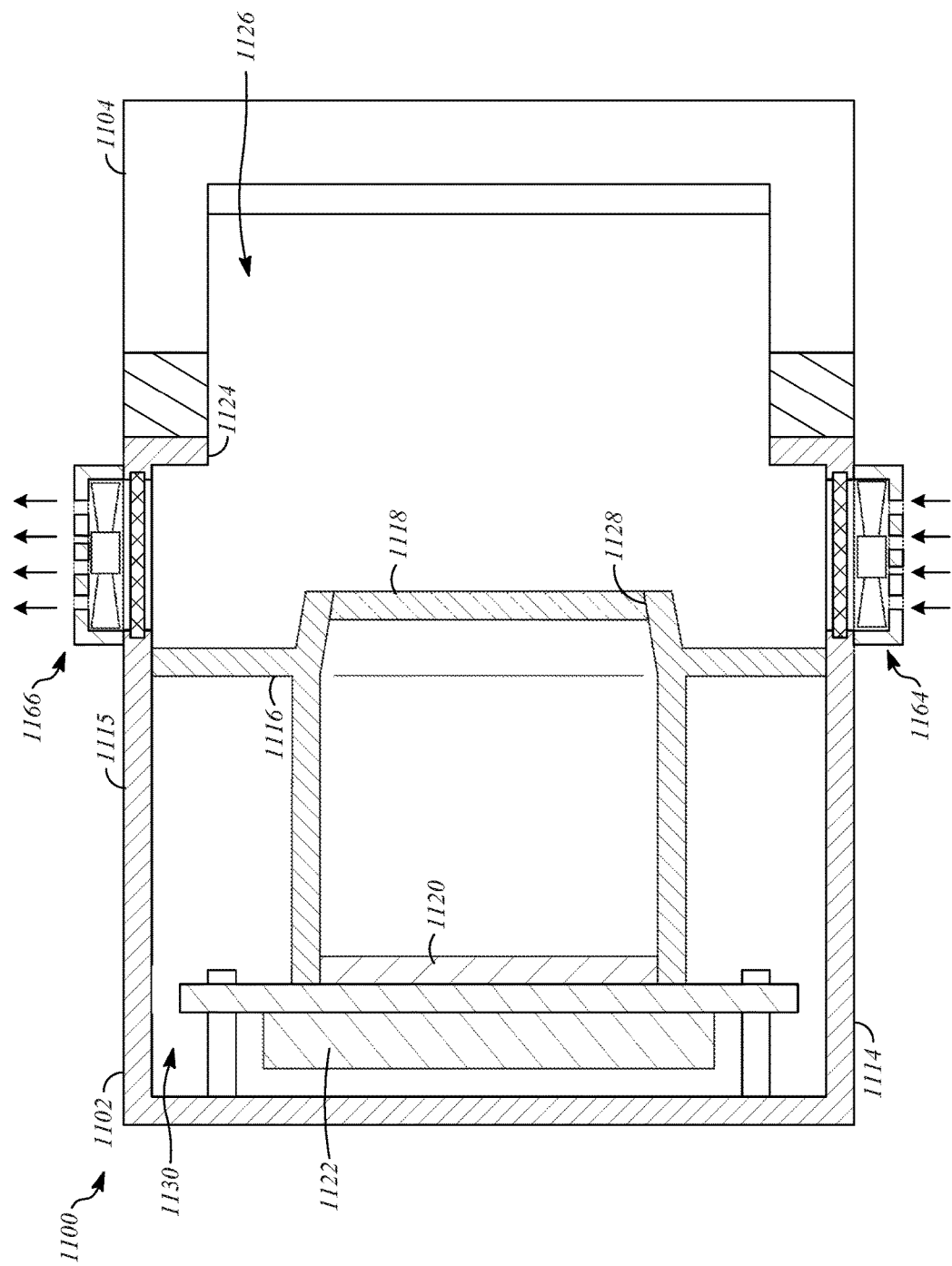
FIG. 11 is a side cross-section view of a head-mounted display including thermal regulation components according to a ninth example.

FIG. 11 is a cross-section view of a head-mounted display 1100. The head-mounted display 1100 is similar to the head-mounted display 100 except as described herein. The head-mounted display 1100 includes a housing 1102, a face seal 1104, a lower wall 1114, an upper wall 1115, a divider wall 1116, lenses 1118, display devices 1120, electronic components 1122, a peripheral portion 1124 of the housing 1102, an eye chamber 1126, apertures 1128, and a component chamber 1130, all of which are analogous to similarly-named components of the head-mounted display 100.

The thermal regulation components of the head-mounted display 1100 include an intake fan 1164 and an exhaust fan 1166. The intake fan 1164 is configured similar to the intake fan 450 but is positioned to actively draw air into the eye chamber 326 through an opening that extends through the lower wall 1114. The exhaust fan 1166 is the same as the exhaust fan 1066 of the head-mounted display 1000.

The exhaust fan 1166 is operated in the manner described with respect to the exhaust fan 340. The intake fan 1164 is operated in the manner described with respect to the intake fan 450. Air is expelled from the eye chamber 1126 by the exhaust fan 1166, and cooler air is actively drawn into the eye chamber 1126 from the exterior by the intake fan 1164.

Figure 12:
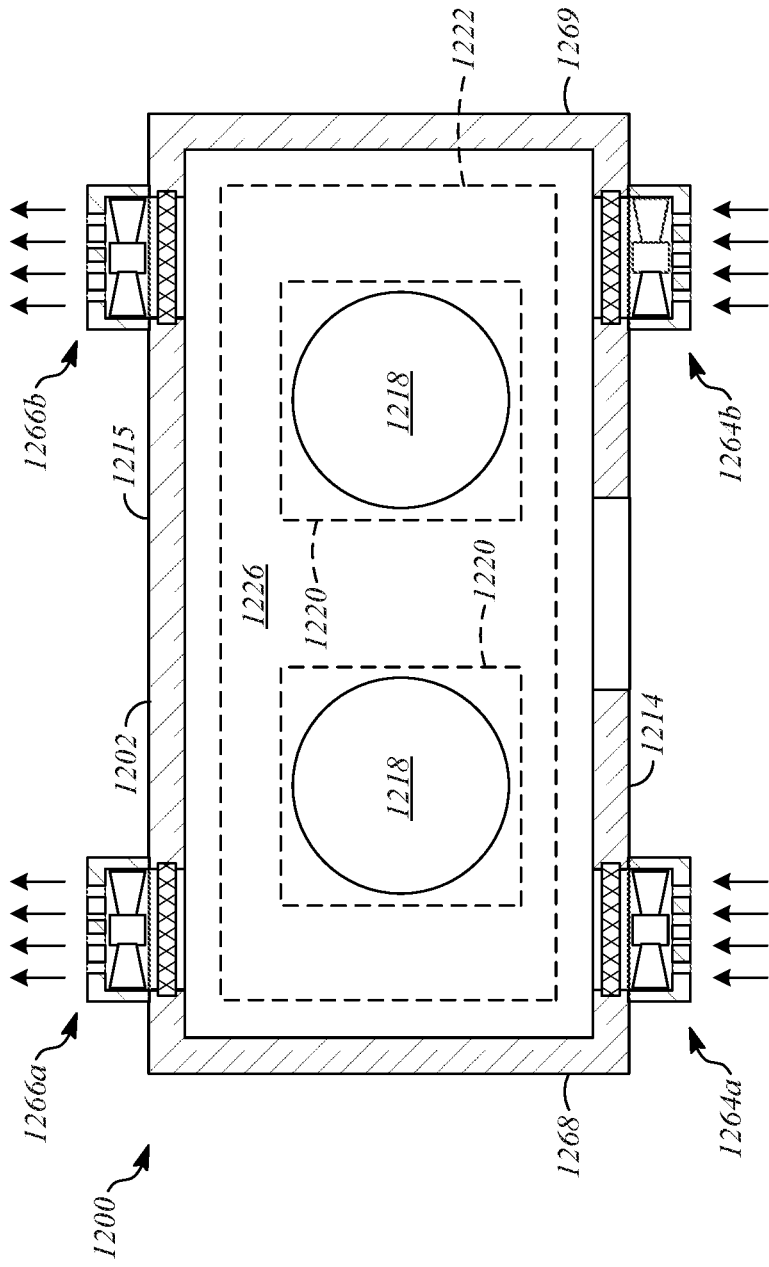
FIG. 12 is a front cross-section view of a head-mounted display including thermal regulation components according to a tenth example.

FIG. 12 is a front cross-section view of a head-mounted display 1200 taken along line B-B of FIG. 2B. The head-mounted display 1200 is similar to the head-mounted display 100 except as described herein. The head-mounted display 1200 may include components analogous to those discussed in connection with the head-mounted display 100, including a housing 1202, a lower wall 1214, an upper wall 1215, lenses 1218, display devices 1220, electronic components 1222, and an eye chamber 1226.

The thermal regulation components of the head-mounted display 1200 include a first intake fan 1264a, a second intake fan 1264b, a first exhaust fan 1266a, and a second exhaust fan 1266b. The first intake fan 1264a and the second intake fan 1264b are configured similar to the intake fan 1164. The first intake fan 1264a and the second intake fan 1264b both are able to actively draw air into the eye chamber 326 through openings that extend through the lower wall 1214. The first exhaust fan 1266a and the second exhaust fan 1266b are configured the same as the exhaust fan 1166 of the head-mounted display 1100.

The first intake fan 1264a and the first exhaust fan 1266a are positioned near a left side wall 1268 of the housing 1202. The first intake fan 1264a and the first exhaust fan 1266a may be located laterally outward from the center of the lens 1218 on the left side of the housing 1202, or may be laterally outward from an outer periphery of the lens 1218 on the left side of the housing 1202. The first intake fan 1264a and the first exhaust fan 1266a, in combination, define a first air flow path within the eye chamber 326. The first air flow path is located laterally outward from the lens 1218 on the left side of the housing 1202, adjacent to the left side wall 1268 of the housing 1202, in order to allow air movement in the eye chamber 326 without having a high-speed air stream that crosses the eyes or nose of the user.

The second intake fan 1264b and the second exhaust fan 1266b are positioned near a right side wall 1269 of the housing 1202. The second intake fan 1264b and the second exhaust fan 1266b may be located laterally outward from the center of the lens 1218 on the right side of the housing 1202, or may be laterally outward from an outer periphery of the lens 1218 on the right side of the housing 1202. The second intake fan 1264b and the second exhaust fan 1266b, in combination, define a second air flow path within the eye chamber 326. The second air flow path is located laterally outward from the lens 1218 on the right side of the housing 1202, adjacent to the right side wall 1269 of the housing 1202, in order to allow air movement in the eye chamber 326 without having a high speed air stream that crosses the eyes or nose of the user.

The first exhaust fan 1266a and the second exhaust fan 1166b are operated in the manner described with respect to the exhaust fan 340. The first intake fan 1264a and the second intake fan 1264b are operated in the manner described with respect to the intake fan 450. Air is expelled from the eye chamber 1226 by first exhaust fan 1266a and the second exhaust fan 1166b, and cooler air is actively drawn into the eye chamber 1226 from the exterior by the first intake fan 1264a and the second intake fan 1264b.

Figure 13:
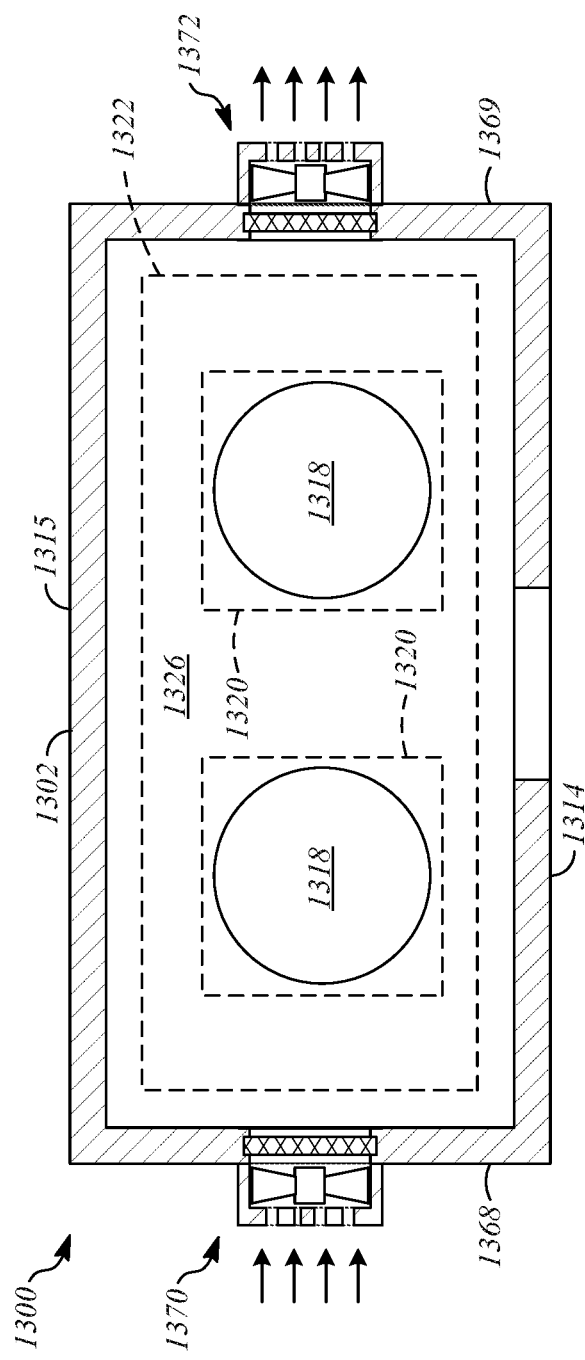
FIG. 13 is a side cross-section view of a head-mounted display including thermal regulation components according to an eleventh example.

FIG. 13 is a front cross-section view of a head-mounted display 1300 taken along line B-B of FIG. 2B. The head-mounted display 1300 is similar to the head-mounted display 100 except as described herein. The head-mounted display 1300 may include components analogous to those discussed in connection with the head-mounted display 100, including a housing 1302, a lower wall 1314, an upper wall 1315, lenses 1318, display devices 1320, electronic components 1322, and an eye chamber 1326.

The thermal regulation components of the head-mounted display 1300 include a first fan 1370 and a second fan 1372. The first fan 1370 and the second fan 1372 are configured similar to the intake fan 1164 of the head-mounted display 1100, but differ in position and mode of operation. The first fan 1370 is positioned on the left side wall 1368 of the housing 1302 to force air into or draw air out of the eye chamber 1326 through an opening formed in the left side wall 1368 of the housing 1302. The second fan 1372 is positioned on the right side wall 1369 of the housing 1302 to force air into or draw air out of the eye chamber 1326 through an opening formed in the right side wall 1369 of the housing 1302.

The first fan 1370 and the second fan 1372 may be operated in the manner described with respect to the exhaust fan 340 and the intake fan 450. The first fan 1370 and the second fan 1372 can each be operated in an intake mode or an exhaust mode. By operating the first fan 1370 in the intake mode and operating the second fan 1372 in the exhaust mode, left-to-right air flow is established in the eye chamber 1326. By operating the first fan 1370 in the exhaust mode and operating the second fan 1372 in the intake mode, right-to-left air flow is established in the eye chamber 1326.

In some implementations, air flow in the eye chamber of a head-mounted display, such as the eye chamber 1226 of the head-mounted display 1200 or the eye chamber 1326 of the head-mounted display 1300, can be controlled to correspond to content displayed by the head-mounted display, such as by causing a high air flow speed to correspond to windy conditions seen in displayed content, or to move air in a particular direction in correspondence with displayed content. For example, the displayed content may depict a right-to-left wind, and an equivalent right-to-left air flow may be established using the first fan 1370 and the second fan 1372.

Figure 14:
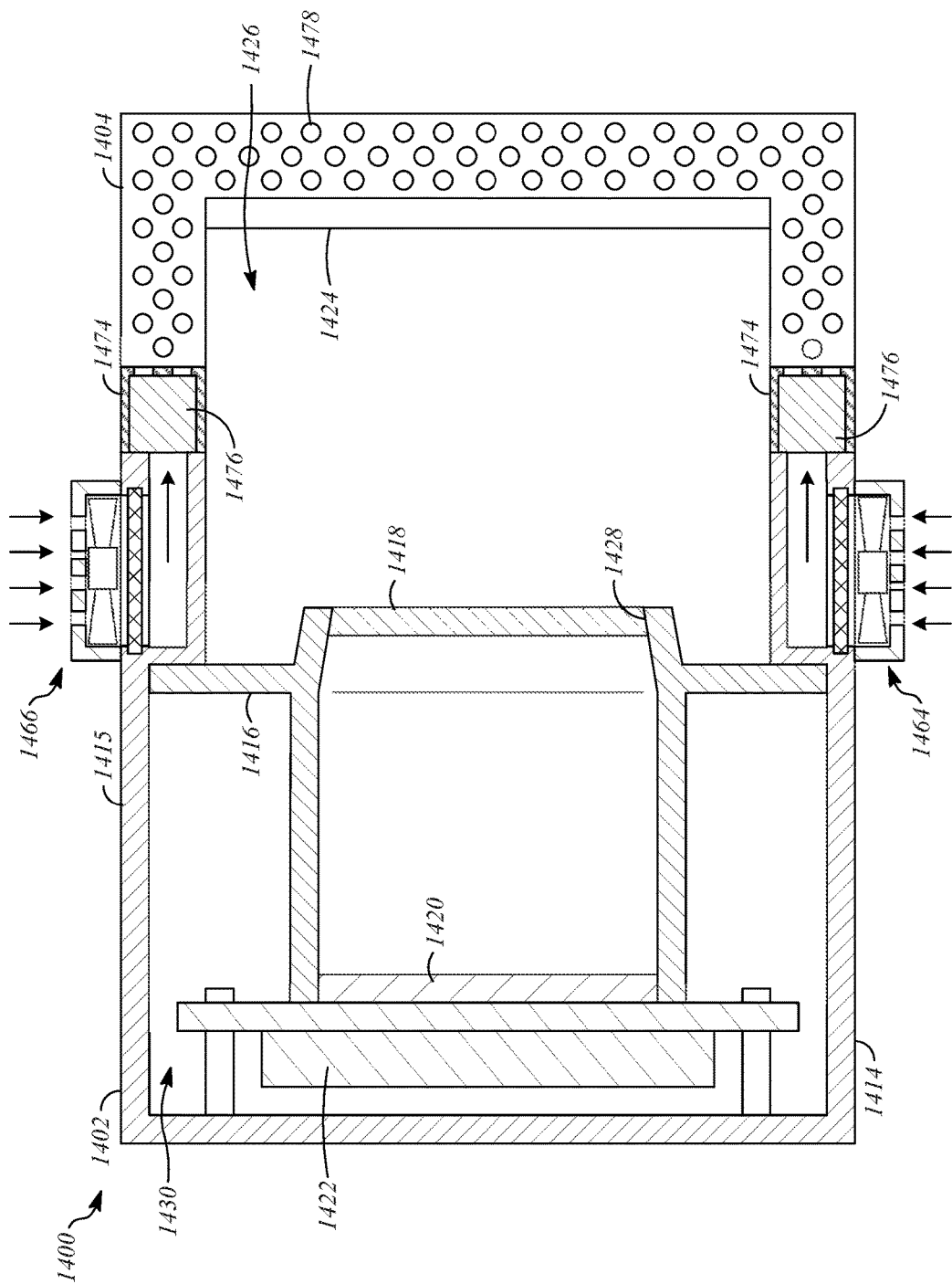
FIG. 14 is a front cross-section view of a head-mounted display including thermal regulation components according to a twelfth example.

FIG. 14 is a cross-section view of a head-mounted display 1400. The head-mounted display 1400 is similar to the head-mounted display 100 except as described herein. The head-mounted display 1400 includes a housing 1402, a face seal 1404, a lower wall 1414, an upper wall 1415, a divider wall 1416, lenses 1418, display devices 1420, electronic components 1422, a peripheral portion 1424 of the housing 1402, an eye chamber 1426, apertures 1428, and a component chamber 1430, all of which are analogous to similarly-named components of the head-mounted display 100.

The thermal regulation components of the head-mounted display 1400 include a lower intake fan 1464 and an upper intake fan 1466. The lower intake fan 1464 is configured similar to the intake fan 450 but is positioned to actively draw air through an opening that extends through the lower wall 1414. The upper intake fan 1466 is configured similar to the intake fan 450 but is positioned to actively draw air through an opening that extends through the upper wall 1415. The lower intake fan 1464 and the upper intake fan 1466 each supply air to the face seal 1404. The face seal 1404 is cooled by air that flows through it. The face seal 1404 may also incorporate structures that direct air flow toward the user, to cool the user's skin.

In the illustrated example, the face seal 1404 includes an interior portion 1474, a cover portion 1476, and openings 1478. The interior portion 1474 defines an air flow path through the face seal 1404. In one implementation, the interior portion 1474 is made from an air-permeable material such as an open-cell foam material that allows air to flow through it. The cover portion 1476 is generally air-impermeable, such that air does not flow through it, and instead is conducted along the length of the face seal 1404. The openings 1478 are formed through the cover portion 1476 to allow air flow from the interior portion 1474 to exit the face seal 1404. As examples, the openings 1478 may be holes or perforations that are spaced from one another in a pattern or array on the cover portion 1476.

The lower intake fan 1464 and the upper intake fan 1466 each actively draw air into the housing 1402 and direct the air into the face seal 1404. Air flows through the interior portion 1474 of the face seal 1404. In implementations that include the openings 1478, the air flow then exits through the openings 1478, such as at locations that are adjacent to the user's skin.

Figure 15:
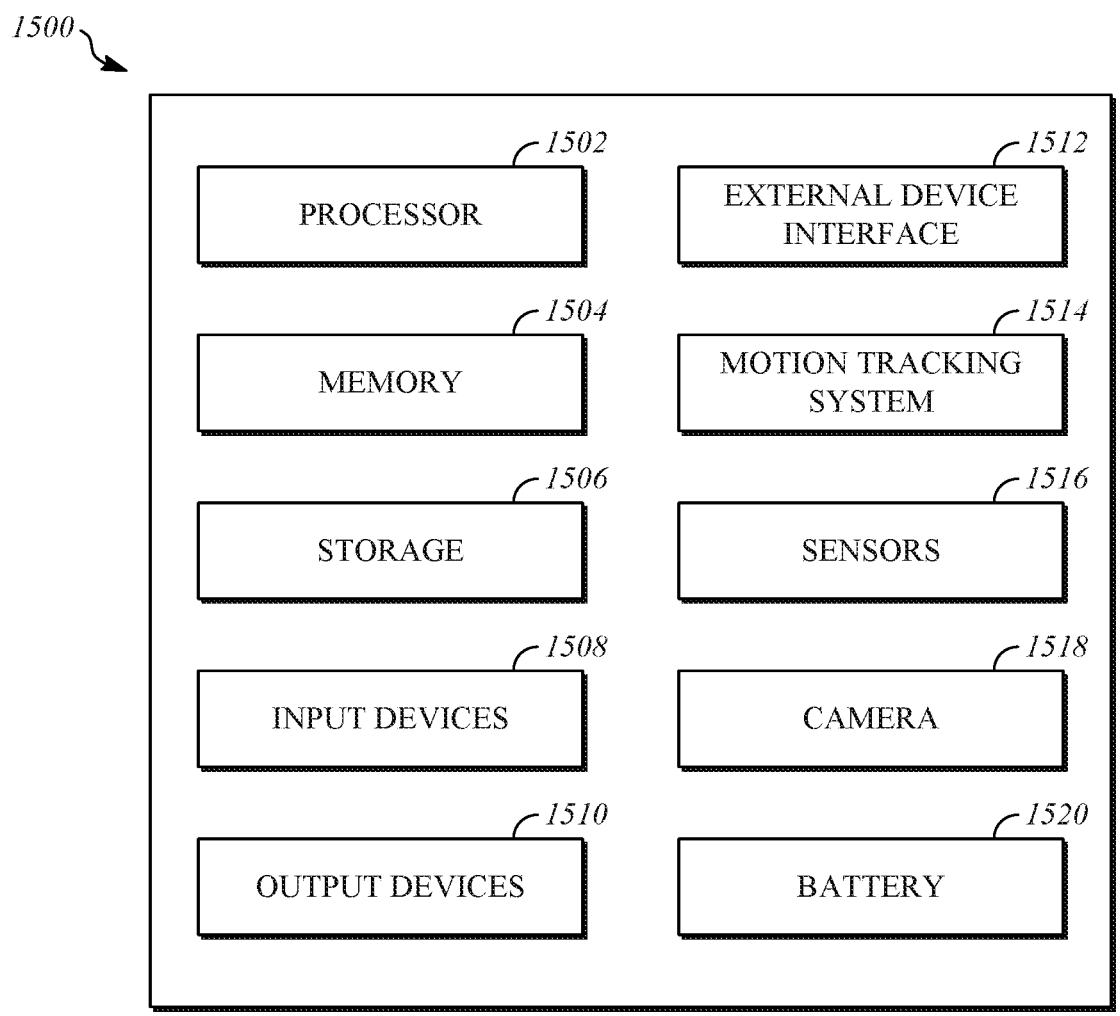
FIG. 15 is a block diagram that shows an example of a hardware configuration for electronic components of a head-mounted display.

FIG. 15 is a block diagram that shows an example of a hardware configuration for the electronic components 1500 of the head-mounted display 100. In the illustrated example, the electronic components 1500 include a processor 1502, memory 1504, storage 1506, input devices 1508, output devices 1510, an external device interface 1512, a motion tracking system 1514, sensors 1516, a camera 1518, and a battery 1520. In some embodiments, some or all of the electronic components 1500 are implemented as a system on a chip.

The processor 1502 is operable to execute computer program instructions and perform operations described by the computer program instructions. As an example, the processor 1502 may be a conventional device such as a central processing unit. The memory 1504 may be a volatile, high-speed, short-term information storage device such as a random-access memory module. The storage 1506 may be a non-volatile information storage device such as a hard drive or a solid-state drive. The input devices 1508 may include any type of human-machine interface such as buttons, switches, motion sensitive controllers, a keyboard, a mouse, a touchscreen input device, a gestural input device, or an audio input device (e.g., a microphone). The output devices 1510 may include any type of device operable to provide an indication to a user regarding an operating state, such as the display devices 320 of the head-mounted display 100, or an audio output device (e.g., speakers).

The external device interface 1512 is a wired or wireless interface using any type of protocol. As one example, the external device interface 1512 may include a wired connection to an external computing device that is utilized to generate content, such as content that is displayed by the display devices 320 of the head-mounted display 100, such as by rendering the content. As another example, the external device interface 1512 can allow wireless connection to internet access to utilize server-based resources during operation of the head-mounted display 100.

The motion tracking system 1514 can detect three axis rotations and accelerations of the head-mounted display 100, and provide this information as inputs to the processor 1502 or to other systems. As an example, information output by the motion tracking system 1514 can be utilized to implement view tracking in certain software applications, and the information output by the motion tracking system 1514 can be used by the software application during generation of content. The motion tracking system 1514 can include, for example, an inertial measuring unit that utilizes accelerometers, gyroscopes, and magnetometers to output information that describes motion. The motions tracking system can also include other types of motion tracking technologies, such as structured-light stereo devices, depth cameras, LIDAR devices, radar devices, ultrasonic devices, infrared detectors that measure signals from external infrared sources, and infrared beacons that emit signals that can be measured by external infrared detectors.

The sensors 1516 various types of sensors in addition to those in the motion tracking system. Examples include biometric sensors, temperature sensors, light sensors and force sensors. Some of the sensors 1516 may be included in other components. For example, a temperature sensor may be incorporated in the processor 1502.

The camera 1518, which can include a single camera or multiple cameras, can be included to capture video of the environment surrounding the head-mounted display 100 or can be used to sense features in the environment or features of the user. As one example, the camera 1518 can be mounted in an eye chamber of a head-mounted display and used for eye tracking, such as in the eye chamber 326 of the head-mounted display 100.

The battery 1520 supplies electrical power to various components of the head-mounted display 100, including the electronic components 1500. As an example, the battery 1520 can be a rechargeable battery of any suitable type.

As described above, one aspect of the present technology is the gathering and use of data available from various sources to improve thermal comfort during use of a head-mounted device. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to adjust thermal regulation based on stored profiles. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case personalized thermal regulation, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, thermal regulation can be performed without stored user information, for example, by regulating temperature based on non-personal information data or a bare minimum amount of personal information, such as the content being requested by the device associated with a user, other non-personal information available to the head-mounted device or publicly available information.

What is claimed is:

1. A head-mounted display to be worn by a user, comprising:
   a housing;
   a component chamber defined in the housing;
   electronic components that generate heat, wherein the electronic components are located in the component chamber of the housing; and a first fan for causing air to flow through the component chamber; and an electromechanical flow control component that is operable to move between first and second positions to vary air flow through the housing.

2. The head-mounted display of claim 1, wherein the first fan directs air out of an upper part of the component chamber.

3. The head-mounted display of claim 2, further comprising:

a second fan that directs air into a lower part of the component chamber.

4. The head-mounted display of claim 2, further comprising:

an eye chamber defined in the housing; and a first vent that allows air to pass from the eye chamber into the component chamber.

5. The head-mounted display of claim 4, further comprising:

a second vent that allows air to enter the eye chamber from outside of the housing.

6. The head-mounted display of claim 4, further comprising:

a second fan that directs air into the component chamber.

7. The head-mounted display of claim 1, wherein operation of the first fan is controlled based on a temperature of the electronic components.

8. The head-mounted display of claim 1, wherein operation of the first fan is controlled based on an air temperature in the component chamber.

9. The head-mounted display of claim 1, further comprising:

an eye chamber defined in the housing, and an air temperature sensor operable to sense air temperature in the eye chamber, wherein operation of the first fan is controlled based on the air temperature in the eye chamber.

10. The head-mounted display of claim 1, further comprising:

an eye chamber defined in the housing, and a humidity sensor operable to sense humidity in the eye chamber, wherein operation of the first fan is controlled based on the humidity in the eye chamber.

11. The head-mounted display of claim 1, further comprising:

a skin temperature sensor operable to sense a skin temperature of the user, wherein operation of the first fan is controlled based on the skin temperature of the user.

12. The head-mounted display of claim 1, further comprising:

a perspiration sensor operable to sense perspiration by the user, wherein operation of the first fan is controlled based on the perspiration by the user.

13. The head-mounted display of claim 1, further comprising:

a headband that is connected to the housing and configured to support the housing relative to the user;

display devices that are operable to display content output by the electronic components;

an eye chamber defined by the housing; and a face seal that extends around the eye chamber.

14. A head-mounted display to be worn by a user, comprising:

a housing;

an eye chamber defined by the housing;

a face seal that has an interior portion that is formed from an air-permeable material and a cover portion formed from an air impermeable material, wherein openings are formed through the cover portion to allow airflow out of the interior portion of the face seal; and a fan that directs air into the interior portion of the face seal such that the interior portion conducts the air along a portion of a length dimension of the face seal to the openings.

15. The head-mounted display of claim 14, wherein the air is conducted through the interior portion of the face seal along a length dimension of the face seal from the fan to the openings.

16. The head-mounted display of claim 14, wherein the openings are spaced apart in an array on the cover portion.

17. The head-mounted display of claim 14, wherein the air exits through the openings at locations that are adjacent to the user's skin.

18. A head-mounted display to be worn by a user, comprising:

a housing;

an eye chamber defined by the housing;

a display;

electronic components that cause content to be output by the display;

a fan that causes air to flow through the eye chamber, wherein the fan is controlled by the electronic components such that the air flow through the eye chamber changes to correspond to the content that is output by the display, and an electromechanical flow control component that is operable to move between first and second positions to vary air flow through the eye chamber.

19. The head-mounted display of claim 18, wherein the fan is controlled to vary an air flow speed to correspond to the content that is output by the display.

20. The head-mounted display of claim 18, wherein the fan is controlled to vary an air flow direction to correspond to the content that is output by the display.

* * * * *